(12) United States Patent
Kim

(10) Patent No.: US 7,179,735 B2
(45) Date of Patent: Feb. 20, 2007

(54) METHOD OF MANUFACTURING SEMICONDUCTOR DEVICE

(75) Inventor: Sang Deok Kim, Seoul (KR)

(73) Assignee: Hynix Semiconductor Inc., Kyungki-do (KR)

( * ) Notice: Subject to any disclaimer, the term of this patent is extended or adjusted under 35 U.S.C. 154(b) by 54 days.

(21) Appl. No.: 10/743,578

(22) Filed: Dec. 22, 2003

(65) Prior Publication Data

US 2004/0266221 A1 Dec. 30, 2004

(30) Foreign Application Priority Data

Jun. 30, 2003 (KR) .................... 10-2003-0043688

(51) Int. Cl.
*H01L 21/4763* (2006.01)

(52) U.S. Cl. .................... 438/624; 438/695; 438/697

(58) Field of Classification Search ........ 438/694–702, 438/624
See application file for complete search history.

(56) References Cited

U.S. PATENT DOCUMENTS

| 6,033,981 | A | 3/2000 | Lee et al. .................... 438/624 |
| 6,106,678 | A | 8/2000 | Shufflebotham et al. .................... 204/192.32 |
| 6,265,302 | B1 | 7/2001 | Lim et al. .................... 438/622 |
| 6,291,367 | B1 | 9/2001 | Kelkar .................... 438/778 |
| 6,365,015 | B1* | 4/2002 | Shan et al. .................... 204/192.3 |
| 6,410,446 | B1* | 6/2002 | Tsai et al. .................... 438/695 |
| 6,617,259 | B2 | 9/2003 | Jung et al. .................... 438/763 |
| 6,867,141 | B2 | 3/2005 | Jung et al. .................... 438/695 |
| 2003/0008492 | A1 | 1/2003 | Jung et al. .................... 438/624 |
| 2003/0207553 | A1 | 11/2003 | Jung et al. .................... 438/585 |
| 2005/0032382 | A1* | 2/2005 | Rossman .................... 438/695 |

FOREIGN PATENT DOCUMENTS

| KR | 2003-0004930 | 1/2003 |
| KR | 2003-0007720 | 1/2003 |
| WO | WO 01/93312 | 12/2001 |

* cited by examiner

*Primary Examiner*—Richard A. Booth
(74) *Attorney, Agent, or Firm*—Marshall, Gerstein & Borun LLP

(57) ABSTRACT

Provided is a method of manufacturing a semiconductor device. According to the present invention, it is possible that an interlayer insulating film is planarized by forming the interlayer insulating film using multiple simultaneous deposition-and-etch processes without carrying out a subsequent planarization process. In addition, smoothness can be variably controlled by adjusting the deposition and etch rate.

10 Claims, 8 Drawing Sheets

METHOD OF MANUFACTURING SEMICONDUCTOR DEVICE

BACKGROUND

1. Field of the Invention

The present invention relates to a method of manufacturing a semiconductor device and, more particularly, to a method of manufacturing an interlayer insulating film for isolating a gate of the semiconductor device from the other gate and upper metal.

2. Discussion of Related Art

Generally, in a semiconductor device, gate electrode pattern is formed, and then an interlayer insulating film is formed over the entire structure in order to isolate one gate from the other gates and upper metal wiring. The interlayer insulating film is patterned to form contact holes for opening contact portions, and then, contact plugs are formed by burying the contact holes with metal. In order to uniformly form such contact plugs in an exact size on a wafer, the shape of upper parts of regions in which the contact plugs are to be formed should be smooth. However, in case where an interlayer insulating film is formed by using a conventional method, slopes occur in the shape of the upper parts of the regions in which the contact plugs are to be formed.

FIG. 1 is a SEM picture for explaining conventional problems.

Referring to FIG. 1, particularly, in a NAND-type flash device, a distance between regions, in which contact plugs are to be formed between select transistors positioned at both ends of a cell string, is wider than a cell string interval. Because of such pattern difference, when an HDP oxide film is formed by using a general deposition method, there is occurred a problem that upper parts of regions in which the contact plugs are to be formed are recessed. Thus, there is a problem that it is difficult to form an exact contact plug pattern during a patterning process using a photoresist film. Namely, there is a problem that it is difficult to assure uniformity of a threshold dimension and exact target control over the entire wafer because of poor margin assurance in a photo-engraving process.

SUMMARY OF THE INVENTION

Accordingly, the present invention is contrived to solve the aforementioned problems, and is directed to provide a method of manufacturing a semiconductor device capable of preventing step difference from occurring in an interlayer insulating film due to pattern difference of a lower structure by forming the interlayer insulating film using multiple simultaneous deposition-and-etch processes.

According to a preferred embodiment of the present invention, there is provided a method of manufacturing a semiconductor device, comprising the steps of providing a semiconductor substrate in which a gate electrode pattern is formed and forming an interlayer insulating film consisting of a multi-layered oxide film by carrying out multiple simultaneous deposition-and-etch processes in order to bury the gate electrode pattern.

One aspect of the present invention is to provide a method of manufacturing a semiconductor device, comprising the steps of providing a semiconductor substrate in which a gate electrode pattern is formed; forming a first HDP oxide film over the entire structure by performing a first deposition and etch process simultaneously; and forming a second HDP oxide film over the entire structure by performing a second deposition and etch process simultaneously.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
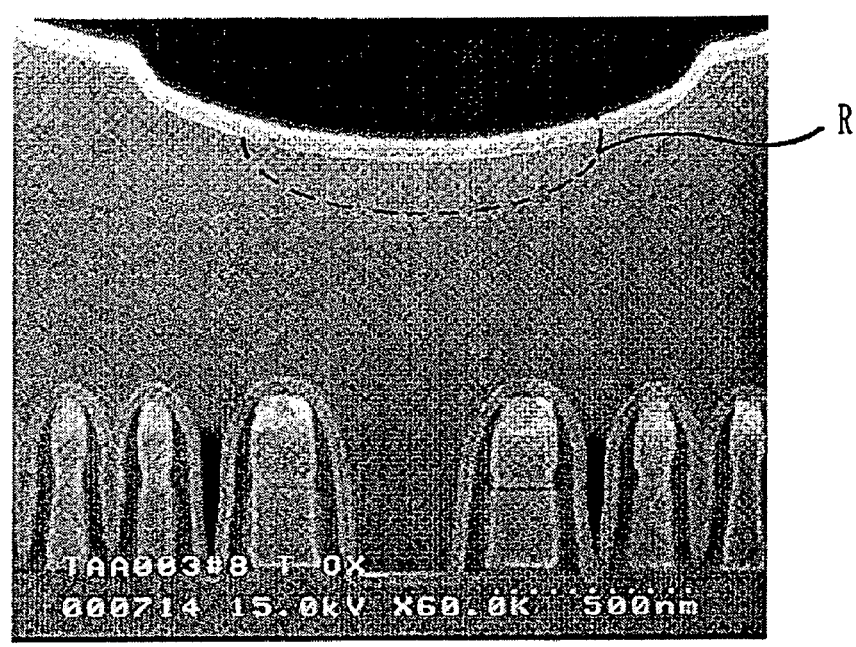
FIG. 1 is a SEM picture for explaining conventional problems.

Hereinafter, embodiments of the present invention will be described with reference to the accompanying drawings. However, the present invention is not limited to embodiments described below, and can be embodied in various aspects. Further, the present embodiments are provided to fully disclose the invention and to inform those who skilled in the art of the scope of the invention. The same numeral in the drawings denotes the same element.

Further, it may be possible to reduce surface step difference of an interlayer insulating film by carrying out a conventional deposition of the interlayer insulating film, a chemical mechanical polishing (CMP) to planarize the interlayer insulating film. However, in the present embodiment, it will be explained that surface step difference of an interlayer insulating film can be reduced without carrying out the chemical mechanical polishing.

Figure 2A:
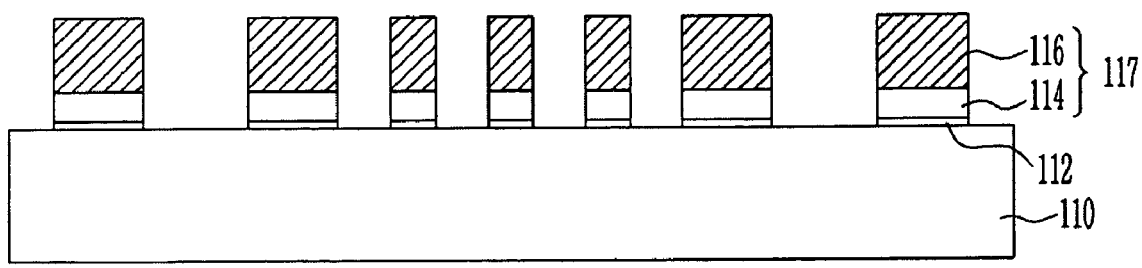
FIGS. 2A to 2C are cross-sectional views for explaining a method of manufacturing a semiconductor device according to the present invention.
Figure 2B:
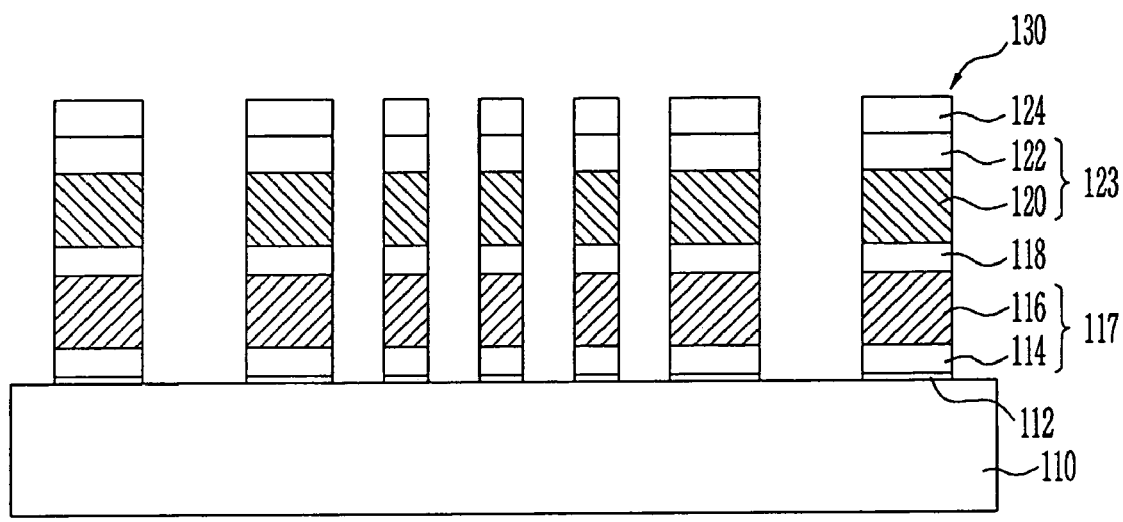
Figure 2C:
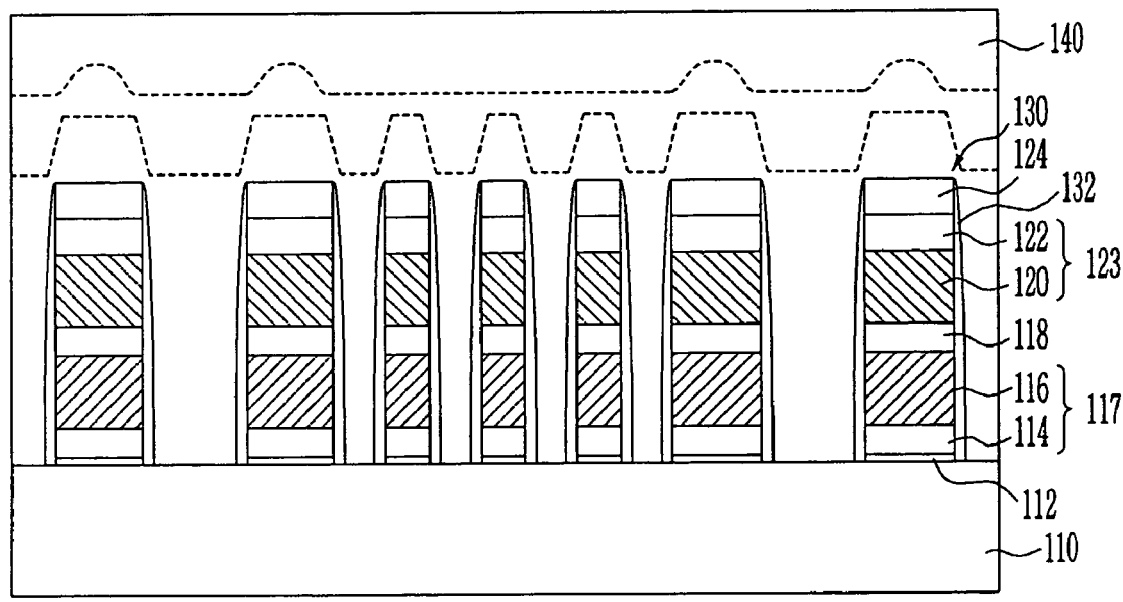

FIGS. 2A to 2C are cross-sectional views for explaining a method of manufacturing a semiconductor device according to the present invention.

Referring to FIG. 2A, a screen oxide film (not shown), which suppresses crystal defect of a surface of a substrate and functions as a buffer layer in the case of surface treatment and ion implantation, is deposited on a semiconductor substrate 110, and then, an ion layer (not shown), which is used for controlling a well or a threshold voltage, is formed by carrying out ion implantation. The screen oxide film is removed, and then a tunnel oxide film 112, a first polysilicon film 114, and a pad nitride film (not shown) are deposited.

Shallow trench isolation (STI) type trenches are formed by etching the pad nitride film, the first polysilicon film 114, the tunnel oxide film 112, and the semiconductor substrate 110 in sequence using an isolation (ISO) mask patterning so as to define active regions and field regions. An oxide film is deposited over the entire structure to bury the trenches. A planarization process is carried out by using the pad nitride film as a stop layer to remove the oxide film on the pad nitride film. As a result, an element isolation film (not shown) for isolating elements is formed.

A nitride strip process using $H_3PO_4$ is carried out to etch the pad nitride film. A natural oxide film and residues, which are formed over the first polysilicon film 114, are removed by carrying out a pre-treatment cleaning process using DHF. It is desirable that a second polysilicon film 116 be deposited over the entire structure, and then a patterning process is carried out to form floating electrodes 117.

Referring to FIG. 2B, a dielectric film 118, a third polysilicon film 120 for a control gate, and a tungsten silicide film 122 are formed. A hard mask film 124 is formed on the tungsten silicide film 122. A patterning process is carried out by using a gate mask to pattern the hard mask film 124. An etch process is carried out by using the patterned hard mask film 124 as an etch mask to etch the tungsten silicide film 122 and the third polysilicon film 120 so as to form control gates 123. Subsequently, the dielectric film 118 and the floating gate electrodes 117 are patterned to isolate the floating gate electrodes 117. As a result, gate electrodes 130 are formed. Each of the gate electrodes comprises a tunnel oxide film 112, an isolated floating gate electrode 117, a dielectric film 118, and a control gate electrode 123.

Referring to FIG. 2C, an oxidation process is carried out for compensating a loss which occurs in the etching of a gate so as to form side wall oxide films 132 on gate side walls. An interlayer insulating film is formed using a multiple deposition-and-etch processes over the entire structure so as to isolate the gate electrodes 130 from each other and electrically isolate them from upper metal wiring (not shown). The interlayer insulating film 140 is patterned to form metal plugs (not shown).

It is desirable that the oxidation process be carried out under the process condition that a phenomenon in which a substance film comprising an oxide film in the gate electrode 130 becomes thick can be minimized. A simultaneous deposition-and-etch process means carrying out a process in which a predetermined isolation substance film is deposited and a portion of the isolation substance film is etched simultaneously (referring to a dotted lined area of FIG. 2C). It is desirable that deposition-and-etch rate be in a range of 1 to 25. It is desirable that the interlayer insulating film 140 be simultaneously deposited and etched by using a high-density plasma apparatus.

The upper surface of the interlayer insulating film 140 formed using the simultaneous deposition-and-etch process should be smooth because it is easy to assure a margin of a photo-engraving process and to assure uniformity of its threshold dimension and exact target control over the entire wafer when a patterning process is carried out using a photoresist film.

Hereinafter, the simultaneous deposition-and-etch process will be specifically explained with reference to the accompanying drawings.

Figure 3A:
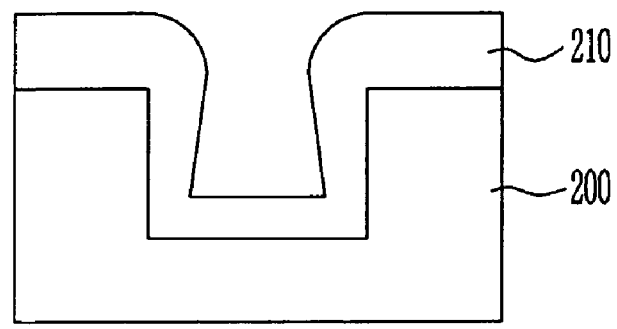
FIGS. 3A to 3C are conceptual views in case where multiple deposition-and-etch processes are carried out according to a procedure including a deposition step, an etching step, and a deposition step.
Figure 3B:
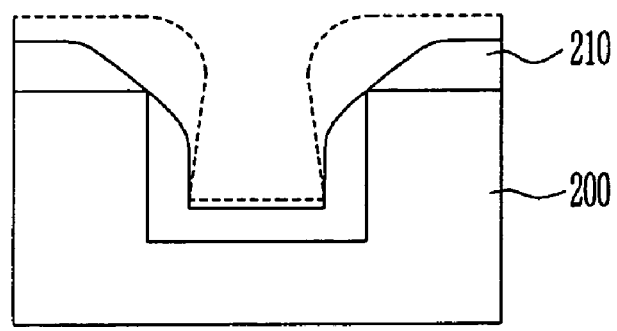
Figure 3C:
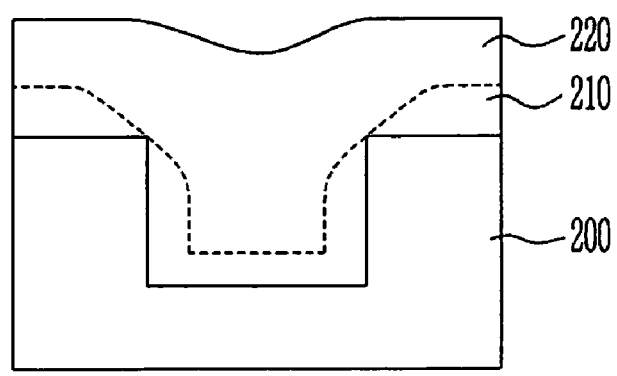
Figure 4A:
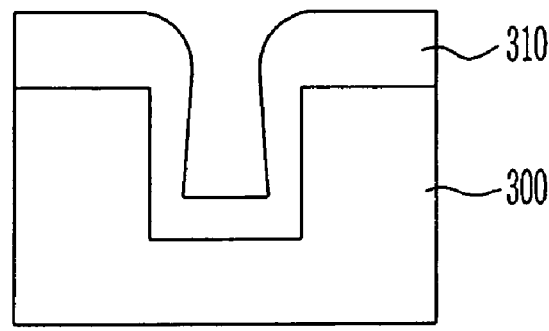
FIGS. 4A to 4E are conceptual views in case where multiple deposition-and-etch processes are carried out according to a procedure including a deposition step, an etching step, a deposition step, an etching step, and a deposition step.
Figure 4B:
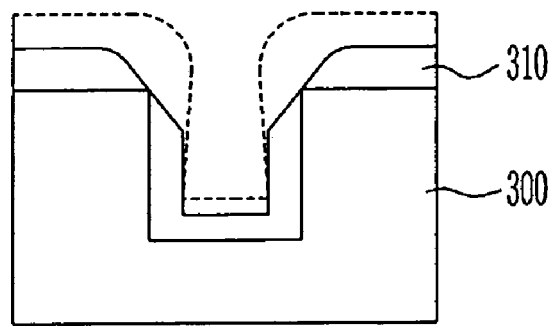
Figure 4C:
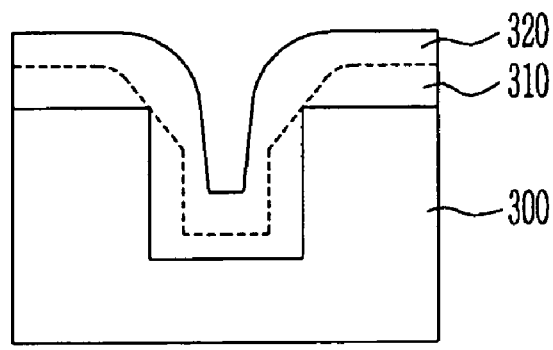
Figure 4D:
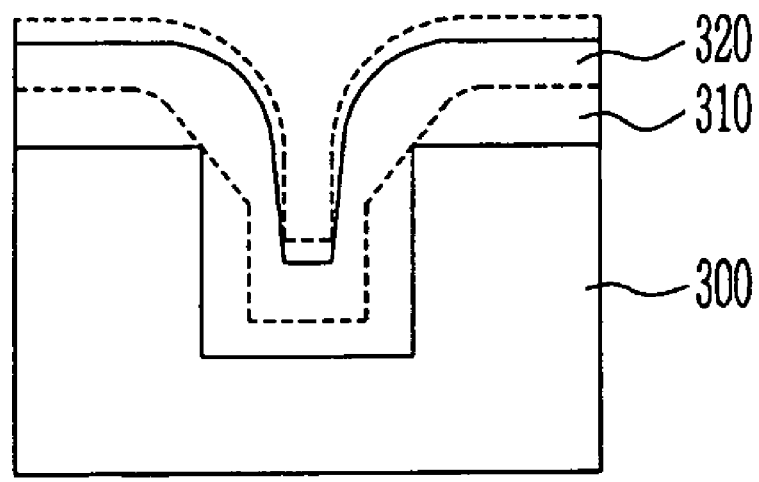
Figure 4E:
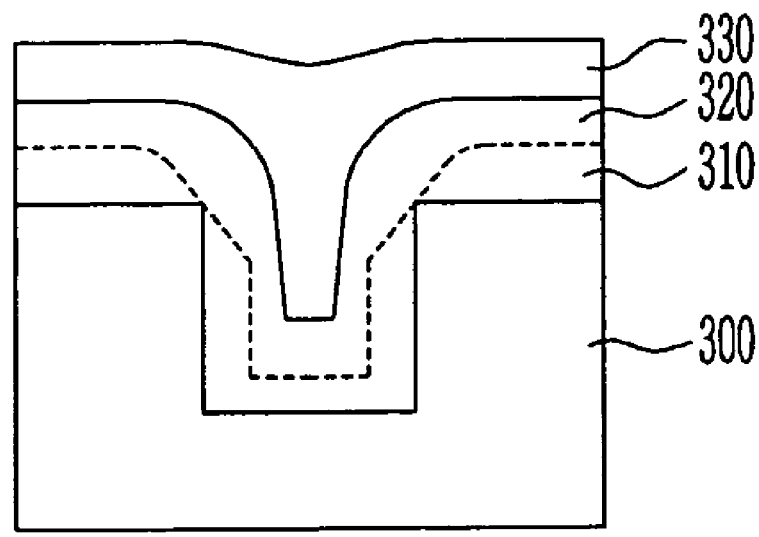

FIGS. 3A to 3C are conceptual views in case multiple deposition-and-etch processes are carried out according to a procedure including a deposition step, an etching step, and a deposition step. FIGS. 4A to 4E are conceptual views in case multiple deposition-and-etch processes are carried out according to a procedure including a deposition step, an etching step, a deposition step, an etching step, and a deposition step.

Referring to FIGS. 3A to 3C, a first HDP oxide film 210 is deposited on a semiconductor substrate 200, in which a step difference occurred between gate electrodes, by carrying out a first deposition step along the step difference of the entire structure. A portion of the first HDP oxide film 210 is removed by carrying out a first etching process using a plasma sputtering (referring to dotted lined area of FIG. 3B). A second HDP oxide film 220 is deposited on the first HDP oxide film 210 by carrying out a second deposition step.

Referring to FIGS. 4A to 4E, a first HDP oxide film 310 is deposited by carrying out a first deposition step along the step difference of the semiconductor substrate 300. A portion of the first HDP oxide film 310 is removed by carrying out a first etching process using a plasma sputtering (referring to dotted lined area of FIG. 4B). A second HDP oxide film 320 is deposited on the first HDP oxide film 310 by carrying out a second deposition step. A portion of the second HDP oxide film 320 is removed by carrying out a second etching process. A third HDP oxide film 330 is deposited by carrying out a third deposition step. It is desirable that the deposition step and the etching process are carried out simultaneously.

It is possible to bury the narrower pattern gap of a five-stage step than that of a three-stage step. That is, the more stages are, the more advantages for burying are obtained. Using this principle, the HDP oxide films are formed by carrying out a deposition step and an etching process simultaneously.

Figure 5:
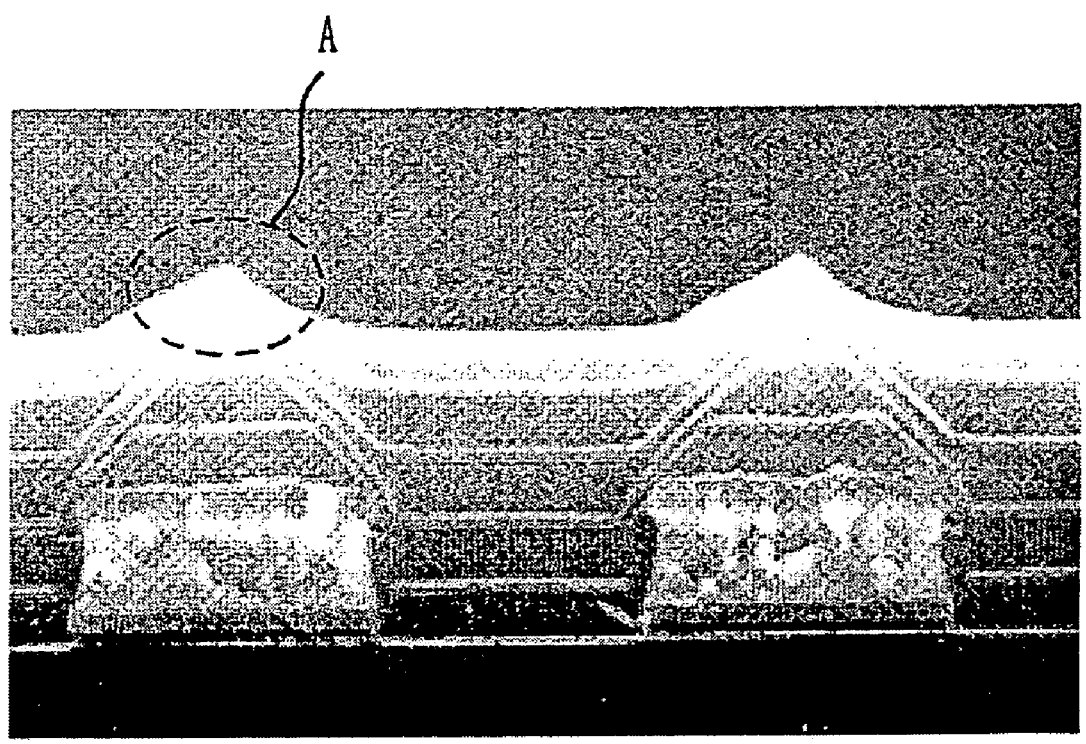
FIG. 5 is a SEM picture obtained after the simultaneous deposition-and-etch process is carried out to form a HDP oxide film.

FIG. 5 is a SEM picture wherein multiple simultaneous deposition-and-etch processes are carried out to form a HDP oxide film.

As shown in FIG. 5, when the HDP oxide film is formed by a simultaneous deposition-and-etch process, the HDP oxide film above protruded pattern regions are protruded in the triangular shape. The triangular shape described above can be controlled by adjusting the deposition-and-etch rate.

Hereinafter, smoothness of the interlayer insulating film according to the deposition-and-etch rate will be specifically explained with reference to the accompanying drawing.

Figure 6A:
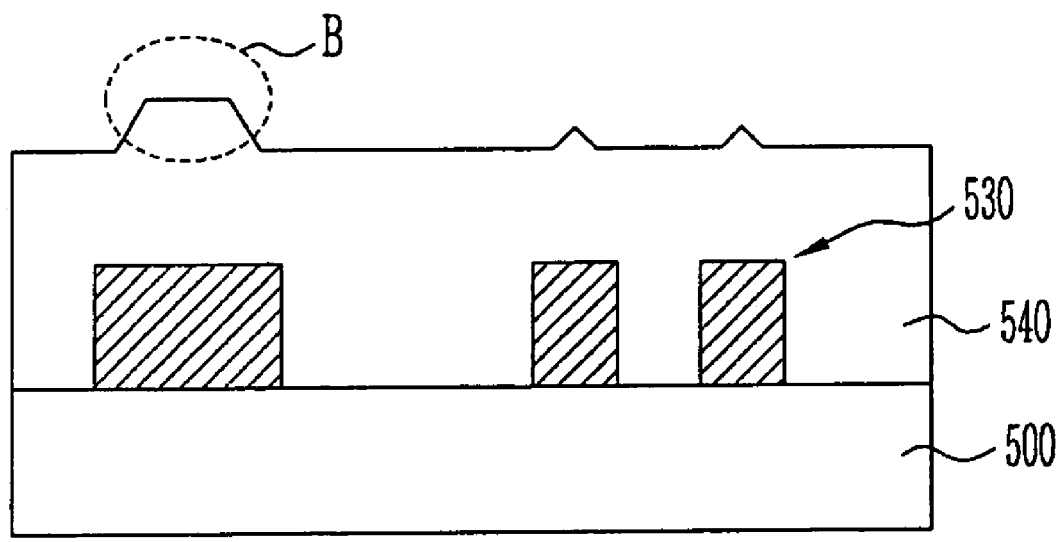
FIG. 6A is a cross-sectional view for explaining an interlayer insulating film formed by a simultaneous deposition-and-etch process when etch rate is lower than deposition rate.
Figure 6B:
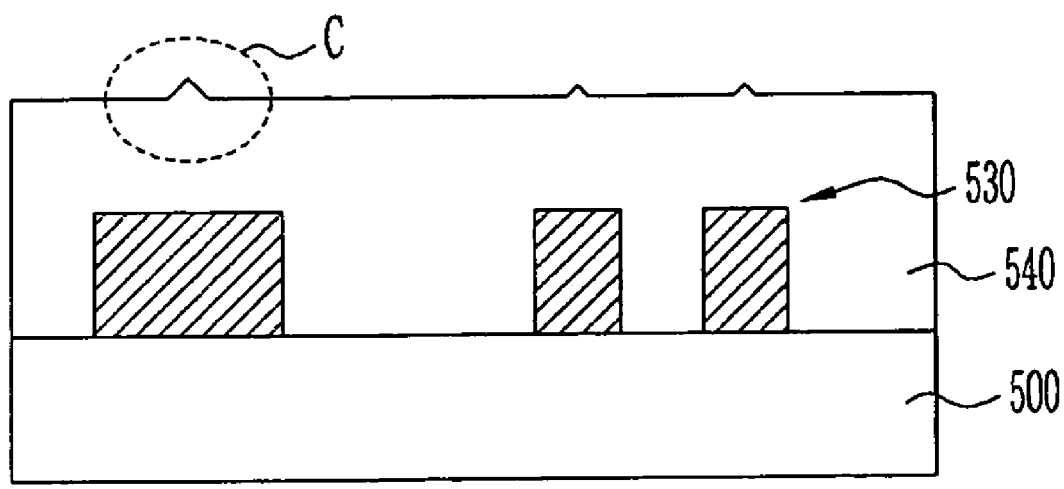
FIG. 6B is a cross-sectional view for explaining an interlayer insulating film formed by a simultaneous deposition-and-etch process when the etch rate is higher than the deposition rate.

FIG. 6A is a cross-sectional view for explaining an interlayer insulating film formed by a simultaneous deposition-and-etch process when etch rate is much lower than deposition rate, and FIG. 6B is a cross-sectional view for explaining an interlayer insulating film formed by a simultaneous deposition-and-etch process when the etch rate is slightly lower than the deposition rate.

Referring to FIGS. 6A and 6B, an interlayer insulating film 540 is formed on a semiconductor substrate 500, in which gate electrodes 530 are formed, by carrying out a simultaneous deposition-and-etch process. But, if the etch rate is low, the upper part of gate electrodes 530 having a larger pattern size may be protruded like a shape of a mountain (referring to B area in FIG. 6A). On the other hand, when the etch rate is high, protrusion rate of the interlayer insulating film 540 becomes too much lower, so that almost completely smooth surface can be obtained (referring to C area in FIG. 6B). As a result, smoothness of the interlayer insulating film 540 can be controlled by adjusting the deposition-and-etch rate of the interlayer insulating film 540 to be formed using the simultaneous deposition-and-etch process.

As described above in FIGS. 3 to 6, when an interlayer insulating film is formed using the simultaneous deposition-and-etch process, surface smoothness thereof extremely differs depending on their own deposition-and-etch rates. The deposition-and-etch rate is referred to as a deposition-sputtering rate (DSR). Higher DSR means that the etch rate is much lower than the deposition rate, and lower DSR means that the etch rate is slightly lower than the deposition rate. It is desirable that the DSR be 1 or more. If the DSR is too much lower, i.e., the etch rate is too much higher, there is a problem that the patterned corners are cut. On the other hand, if the DSR is too much higher, i.e., the deposition rate is too much higher, there is a problem that voids can not be removed, similar to a general chemical vapor deposition method. Thus, it is desirable that the DSR be in a range of 1 to 25. The higher DSR is, the poorer smoothness is obtained. But, the lower DSR is, the better smoothness is obtained. If the DSR is 3, a deposition amount is 3 and an etch amount is 1. But, if the DSR is 25, the deposition amount is 25 and the etch amount is 1.

Now, a case where an interlayer insulating film is formed using a HDP oxide film by carrying out multiple simultaneous deposition-and-etch processes having a DSR described above will be described with reference to the accompanying drawings.

Figure 7A:
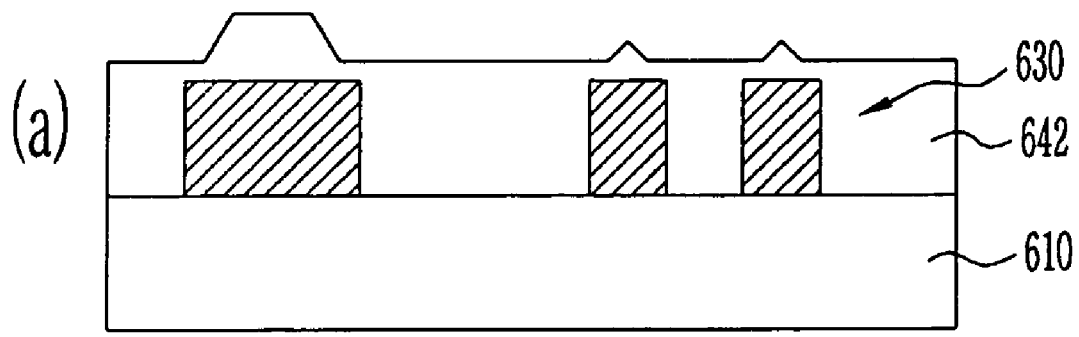
FIGS. 7A and 7B are cross-sectional views for explaining a HDP oxide film formed by a simultaneous deposition-and-etch process of two steps.
Figure 7B:
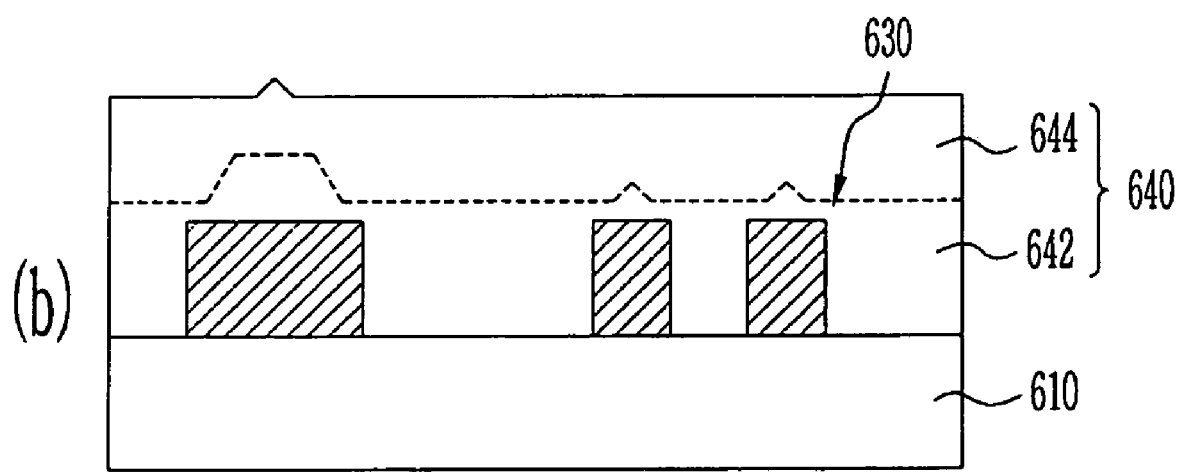

FIGS. 7A and 7B are cross-sectional views for explaining a HDP oxide film formed by a simultaneous deposition-and-etch process of two steps.

Referring to FIG. 7A, a first HDP oxide film 642 is deposited on a semiconductor substrate 610, in which gate electrodes 630 are formed, by carrying out a first simultaneous deposition-and-etch process. In a first deposition process, it is desirable that the first HDP oxide film 642 be formed under a condition that its coverage is excellent and no voids are formed between patterns. Referring to the first HDP oxide film 642, the first HDP oxide film 642 is protruded in regions where the patterns of the gate electrodes 630 are formed, due to the gate electrodes 630, and is recessed at regions between the gate electrodes 630. At this point, the process is carried out under a condition that the DSR is in a range of 3 to 25. Preferably, it is effective that the DSR is in a range of 3 to 10. It is desirable that the first HDP oxide film 642 be formed to have the thickness of 1000 to 10000 Å. It is desirable that the refractive index of the first HDP oxide film 642 is in a range of 1.44 to 1.48 after the first deposition process and the first etch process. It is possible to obtain this by adjusting the DSR.

Referring to FIG. 7B, a second HDP oxide film 644 is formed on the first HDP oxide film 642 by carrying out a second simultaneous deposition-and-etch process so as to form an interlayer insulating film consisting of the first HDP oxide film 642 and the second HDP oxide film 644. It is desirable that the DSR be 3 or less. More preferably, the DSR is in a range of 1 to 3. It is desirable that a simultaneous sputtering-and-etch process using a bias power of 3000 W or more is carried out in the second etching process. It is desirable that the second HDP oxide film 644 be formed to have a thickness capable of reducing the step difference of the first HDP oxide film 642. It is desirable that the second HDP oxide film 644 be formed to have the thickness of 1000 to 10000 Å. It is desirable that the refractive index of the second HDP oxide film 644 be in a range of 1.44 to 1.48 after the second simultaneous deposition-and-etch process.

As a result, most of an upper surface of fine patterns excluding some of wide gate patterns can be smooth. Thus, it is not necessary to carry out a subsequent CMP process. To maximize the surface smoothness, it is desirable that processes be carried out under a condition that the DSR is minimized. It is desirable that smoothness of an interlayer insulating film be increased by varying the DSR of each step in the multiple deposition-and-etch processes of the present invention. To increase the smoothness of the interlayer insulating film, it is desirable that the last deposition-and-etch process be carried out under a condition that the DSR has a lower rate than the deposition-and-etch process carried out previously.

As described above, it is possible that an interlayer insulating film be planarized by forming the interlayer insulating film using multiple simultaneous deposition-and-etch processes without carrying out the subsequent planarization process.

In addition, smoothness can be variably controlled by adjusting the deposition-and-etch rate.

Further, it is possible to improve the yield of devices due to shortened process time, simplified process, and reduced cost according to the planarization process.

What is claimed is:

1. A method of manufacturing a semiconductor device, comprising the steps of:
   providing a semiconductor substrate in which a gate electrode pattern is formed; and
   forming an interlayer insulating film including a multilayered oxide film by performing multiple simultaneous deposition-and-etch processes in order to bury the gate electrode pattern,
   wherein a ratio of deposition rate to etch rate is varied for each of the multiple deposition-and-etch processes, and the last deposition-and-etch process has a lower ratio of deposition rate to etch rate relative to the preceding deposition-and-etch process.

2. The method of manufacturing a semiconductor device according to claim 1, wherein the multiple simultaneous deposition-and-etch process is carried out by performing a depositing and etching process for a HDP oxide film simultaneously.

3. The method of manufacturing a semiconductor device according to claim 1, wherein the ratio of deposition rate to etch rate of the deposition-and-etch processes is in the range of 1 to 25.

4. The method of manufacturing a semiconductor device according to claim 1, wherein the etch process is carried out by using a plasma sputtering.

5. A method of manufacturing a semiconductor device, comprising the steps of:
   providing a semiconductor substrate in which a gate electrode pattern is formed;
   forming a first HDP oxide film over the entire structure by performing a first deposition-and-etch process simultaneously; and
   forming a second HDP oxide film over the entire structure by performing a second deposition-and-etch process simultaneously,
   wherein the first deposition-and-etch process has a higher ratio of deposition rate to etch rate relative to the second deposition-and-etch process.

6. The method of manufacturing a semiconductor device according to claim 5, wherein the etch process is carried out by using a plasma sputtering.

7. The method of manufacturing a semiconductor device according to claim 5, wherein the ratio of deposition rate to etch rate of the first deposition-and-etch process is in the range of 3 to 25.

8. The method of manufacturing a semiconductor device according to claim 5, wherein the ratio of deposition rate to etch rate of the second deposition-and-etch process is in the range of 1 to 3.

9. The method of manufacturing a semiconductor device according to claim 1, wherein the interlayer insulating film has a surface refractive index of 1.44 to 1.48.

10. The method of manufacturing a semiconductor device according to claim 5, wherein the interlayer insulating film has a surface refractive index of 1.44 to 1.48.

* * * * *